United States Patent
Huang et al.

(10) Patent No.: US 6,524,772 B1
(45) Date of Patent: Feb. 25, 2003

(54) METHOD OF MANUFACTURING PHASE GRATING IMAGE SENSOR

(75) Inventors: Chin-Wen Huang, Taichung (TW); Jian-Bin Shiu, Taipei (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/943,017

(22) Filed: Aug. 30, 2001

(51) Int. Cl.⁷ ............................................. H01L 27/14
(52) U.S. Cl. ...................................... 430/321; 216/26
(58) Field of Search ........................ 430/321; 257/432, 257/440; 216/26

(56) References Cited

FOREIGN PATENT DOCUMENTS

| JP | 60-053073 A | * | 3/1985 |
| JP | 60-103309 A | * | 6/1985 |

* cited by examiner

Primary Examiner—John A. McPherson
(74) Attorney, Agent, or Firm—Powell Goldstein Frazer & Murphy LLP

(57) ABSTRACT

A method of manufacturing a phase grating image sensor is disclosed. The method uses conventional photolithography and etching methods to form a plurality of phase grating lenses into the conventional flattening layer on which the conventional micro-lens is formed. The invention thus utilizes phase gratings to replace the conventional micro-lens.

20 Claims, 3 Drawing Sheets

METHOD OF MANUFACTURING PHASE GRATING IMAGE SENSOR

BACKGROUND OF THE INVENTION

1. Field of the Invention

The present invention relates to a method of manufacturing a solid state imaging device, and relates more particularly to a method of manufacturing a phase grating image sensor.

2. Description of the Related Art

In the recent trend toward a compact solid state imaging device, there has arisen a problem of decreased photosensitivity of the solid state imaging device because the area of a light receiving portion is reduced as the device becomes compact. As a countermeasure against this problem, a solid state imaging device comprising a micro lens for collecting light on the light receiving portion has already been realized. The technique for forming a micro lens is indispensable in the production of a solid state imaging device at present.

FIG. 1 is a sectional view showing an exemplified configuration of the conventional solid state imaging device. A conventional solid state imaging device will now be described. In FIG. 1, reference numeral 100 denotes a semiconductor substrate, reference numeral 102 denotes photodiodes formed on the surface of the semiconductor substrate 100 so as to convert incident light into a charge, reference numeral 104 denotes a first flattening layer for flattening the surface of the semiconductor substrate 100, a reference numeral 106 denotes a color filter layer formed on the flattening layer 104, reference numeral 108 denotes a second flattening layer for flattening the level difference on the color filter layer 106, and reference numeral 110 denotes micro lenses formed on the second flattening layer 108 so as to collect light on the corresponding photodiodes 102.

The first flattening layer 104 is formed by coating the semiconductor substrate 100 with a transparent film material in a desired thickness. The color filter layer 106 is formed by, for example, photolithography methods so as to correspond to the respective photodiodes 102. The second flattening layer 108 is also formed by coating the color filter layer 106 with a transparent film material in a desired thickness.

Each of the micro lenses 110 is made of a phenol resin or the like, and is formed above the corresponding photodiode 102 in the shape of a hemisphere. The micro lens 110 has an appropriate height so that light entering the surface thereof can be efficiently collected on the corresponding photodiode 102.

The hemispherical shape of the micro lens 110 is formed through the following procedures: First, a lens resin is coated on the second flattening layer 108. Then, the lens resin is subjected to an exposing treatment using a lens mask and further to a developing treatment, thereby patterning the lens resin so as to be located in the position above each of the photodiodes 102. Then, the patterned photo resist is heated so as to be melted, thereby forming the hemispherical shape of the micro lens 110 by making use of the surface tension.

However, the aforementioned solid state imaging devices and the production methods for the devices have the following problems. In the solid state imaging device of FIG. 1, for the purpose of further improvement of the photosensitivity, it is desired to make a space between the adjacent micro lenses 110 as small as possible so as to enlarge the light receiving area of each micro lens 110.

In the conventional production method, however, when the micro lenses 110 are formed by heating the patterned lens resin (hereinafter referred to as the lens patterns), the heating temperature is set at which the lens patterns are completely melted. Therefore, the melted lens patterns are forced out of the bottoms of the intended patterns.

Furthermore, in the case where the space between the adjacent lens patterns is too small, the adjacent lens patterns which have been forced out of the intended patterns due to the thermal dissolution come in contact with each other, and eventually the lens patterns flow out. This spoils the shape of each micro lens 110, resulting in a smaller surface area of the hemisphere portion as well as a smaller height. The photosensitivity of the device could degrade as the light quantity collected on each photodiode 102 decreases.

Moreover, since the lens patterns are completely melted in the conventional methods, it is impossible, due to the surface tension, to make the height of the micro lens 110 larger than a half of the bottom width of the micro lens 110 in the alignment direction of the light receiving portions. Accordingly, when a distance between the micro lens 110 and the photodiode 102 is small, it is probable that the micro lens 110 cannot be formed into an optimal shape for collecting the light.

In view of the drawbacks mentioned with respect to the prior art process, there is a continuing need to develop new and improved processes that overcome the disadvantages associated with prior art processes. The advantages of this invention are that it solves the problems mentioned above.

SUMMARY OF THE INVENTION

It is therefore an object of the invention to provide a method of manufacturing a phase grating image sensor by merely using conventional photolithography methods.

It is another object of this invention to provide a method of manufacturing a phase grating image sensor to form a phase grating lens instead of a micro-lens.

It is a further object of this invention to provide a method of manufacturing a phase grating image sensor that can avoid the problem of micro-lens shape control resulting from the increasing integration and the conventional processes.

To achieve these objects, and in accordance with the purpose of the invention, the invention uses a method of manufacturing a phase grating image sensor. The method comprises the following steps: providing a substrate having a plurality of photosensitive devices thereon, a first flattening layer on the photosensitive devices, a color filter layer on the first flattening layer and a second flattening layer on the color filter layer, wherein the first flattening layer and the second flattening layer are transparent for the incident beam; forming a photoresist layer over the second flattening layer; transferring a plurality of phase grating patterns into the photoresist layer, wherein each the phase grating patterns comprising a plurality of concentric circles and corresponding to each respective underlying photosensitive device; anisotropically etching the second flattening layer to a predetermined depth to form a plurality of phase grating lenses; and removing the photoresist layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and are not drawn to scale. Moreover, dimensions have been exaggerated in order to provide a clear illustration and understanding of the present invention.

Figure 1:
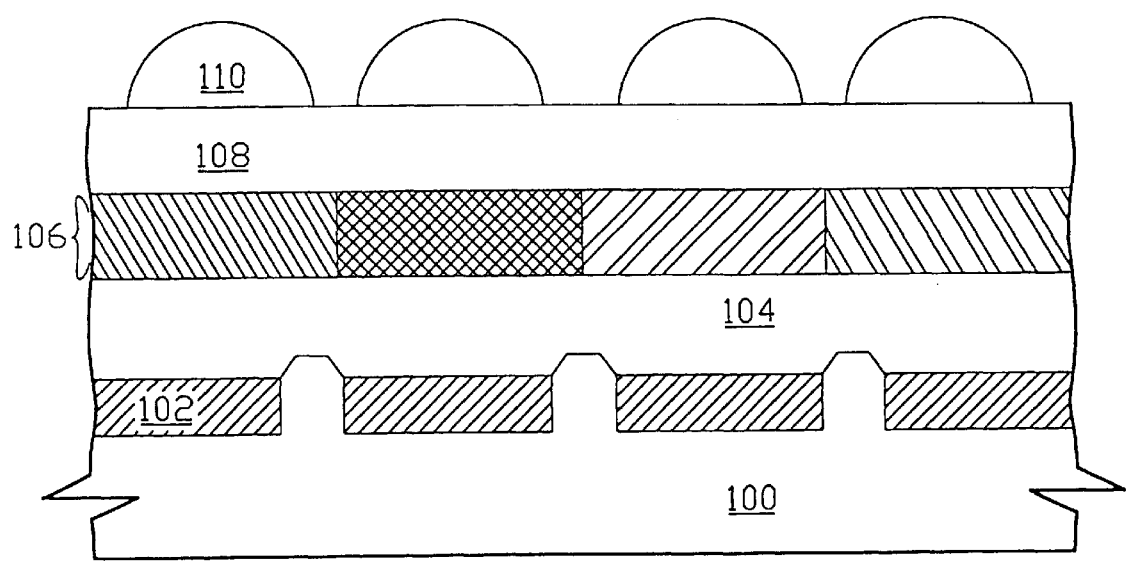
FIG. 1 shows a sectional view for showing an exemplified configuration of the conventional solid state imaging device.
Figure 2A:
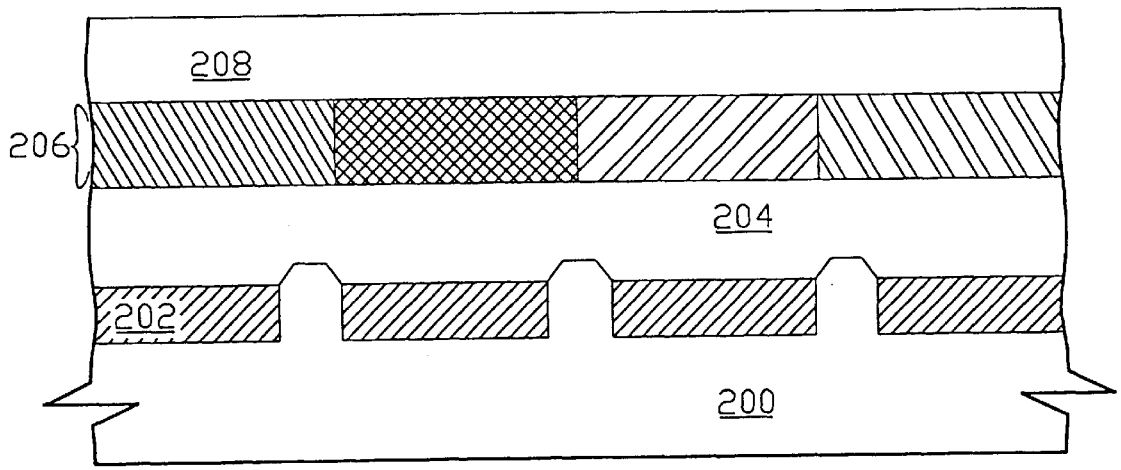
FIG. 2A shows a substrate having photosensitive devices, a flattening layer, a color filter layer formed on the flattening layer, and a top flattening layer formed thereon.

Referring to FIG. 2A, a semiconductor substrate 200, photosensitive devices 202 such as photodiodes formed as light receiving portions on the surface of the semiconductor substrate 200 to convert incident light into a charge, a flattening layer 204 for flattening the surface of the semiconductor substrate 200, a color filter layer 206 formed on the flattening layer 204 by photolithography methods for example, and a flattening layer 208 for flattening the level difference on the color filter layer 206 are shown. The semiconductor substrate 200 comprises, but is not limited to, a silicon substrate. The flattening layer 204 is formed by coating the semiconductor substrate 200 with a transparent film material such as polyimide in a desired thickness. The color filter layer 206 is formed on a position corresponding to the respective photosensitive devices 202 by photolithography methods for example. The color filter layer 206 comprises red, green and blue color filters. The flattening layer 208 is formed on the color filter layer 206 by coating a transparent film material such as polyimide with a desired thickness.

Figure 2B:
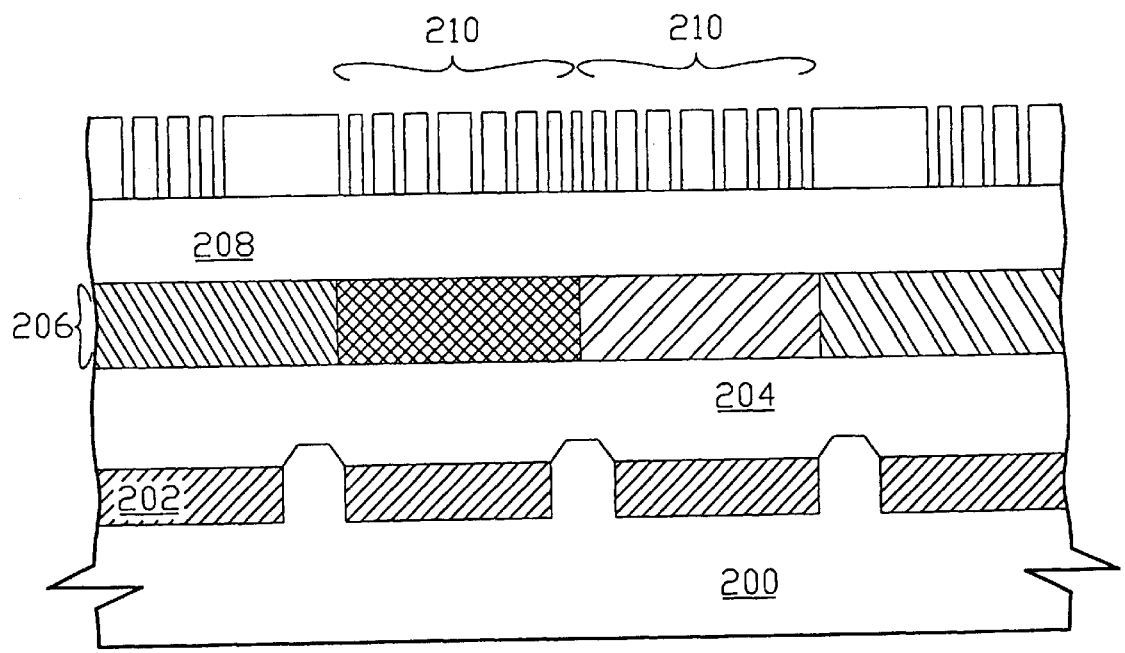
FIG. 2B shows a result of forming a pattern of a photoresist layer on the top flattening layer shown in FIG. 2A.

Referring to FIG. 2B, a photoresist layer pattern is formed on the flattening layer 208. The pattern is formed by the following process steps. Firstly, a photoresist layer is formed over the flattening layer 208 via conventional methods. Then a pattern is transferred into the photoresist layer by conventional photolithography processes. The pattern comprises a plurality of phase grating pattern 210 corresponding to the underlying respective color filter layer 206 and photosensitive device 202. The phase grating pattern 210 comprises a plurality of concentric circle. The photoresist layer can be a positive photoresist layer or a negative one.

Figure 2C:
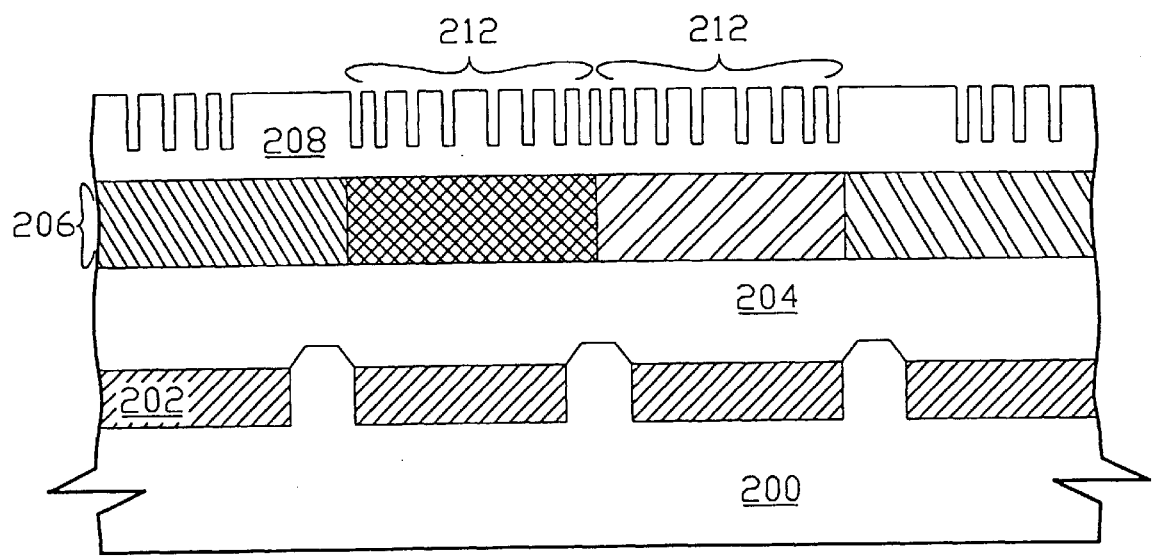
FIG. 2C shows a result of forming a plurality of phase grating lenses into the top flattening layer shown in FIG. 2B.
Figure 3:
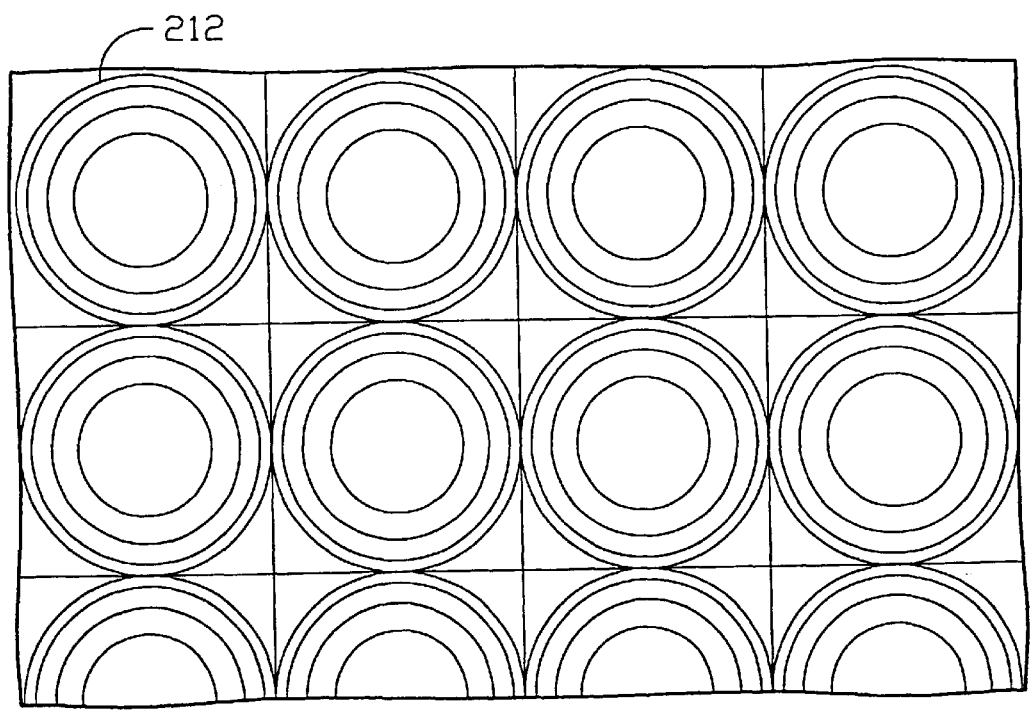
FIG. 3 shows the top view of the structure shown in FIG. 2C.

Referring to FIG. 2C, a plurality of phase grating lenses 212 are formed into the flattening layer 208 using the pattern of photoresist layer shown in FIG. 2B as an etching mask to anisotropically etch the flattening layer 208 to a predetermined depth. Each phase grating lens 212 comprises a plurality of concentric circular trenches each with a predetermined radius. The phase grating lens 212 is used to focus the incident light beam on the photosensitive device 202 therefore the depth of the phase grating lens 212 and the radius of each concentric circular trench depend on where the focus is desired to be located. FIG. 3 shows the top view of the structure shown in FIG. 2C.

The method uses a conventional photolithography and etching methods to form a plurality of phase grating lenses into the conventional flattening layer on which the conventional micro-lens is formed. That is, the invention utilizes phase gratings to replace the conventional micro-lens. The problems of micro-lens shape control resulting from the increasing integration and the conventional process can be avoided.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method of manufacturing a phase grating image sensor, said method comprising:

providing a substrate having a plurality of photosensitive devices thereon, a first flattening layer on said photosensitive devices, a color filter layer on said first flattening layer and a second flattening layer on said color filter layer, wherein said first flattening layer and said second flattening layer are transparent for incident beam;

forming a photoresist layer over said second flattening layer;

transferring a plurality of phase grating pattern into said photoresist layer to expose said second flattening layer, wherein each said phase grating pattern comprises a plurality of concentric circle and corresponds to each respective underlying said photosensitive device;

anisotropically etching said second flattening layer to a predetermined depth to form a plurality of phase grating lens; and removing said photoresist layer.

2. The method according to claim 1, wherein said substrate comprises a silicon substrate.

3. The method according to claim 1, wherein said photosensitive device comprises a photodiode.

4. The method according to claim 1, wherein said first flattening layer comprises a polyimide layer.

5. The method according to claim 1, wherein said second flattening layer comprises a polyimide layer.

6. The method according to claim 1, wherein said color filter layer comprises red, green and blue color filters.

7. The method according to claim 1, wherein said photoresist layer comprises a positive photoresist layer.

8. The method according to claim 1, wherein said photoresist layer comprises a negative photoresist layer.

9. A method of manufacturing a phase grating image sensor, said method comprising:

providing a silicon substrate having a plurality of photodiode thereon, a first flattening layer on said photodiode, a color filter layer on said first flattening layer and a second flattening layer on said color filter layer, wherein said first flattening layer and said second flattening layer are transparent for incident beam;

forming a photoresist layer over said second flattening layer;

transferring a plurality of phase grating pattern into said photoresist layer to expose said second flattening layer, wherein each said phase grating pattern comprises a plurality of concentric circle and corresponds to each respective underlying said photodiode;

anisotropically etching said second flattening layer to a predetermined depth to form a plurality of phase grating lens; and removing said photoresist layer.

10. The method according to claim 9, wherein said first flattening layer comprises a polyimide layer.

11. The method according to claim 9, wherein said second flattening layer comprises a polyimide layer.

12. The method according to claim 9, wherein said color filter layer comprises red, green and blue color filters.

13. The method according to claim 9, wherein said photoresist layer comprises a positive photoresist layer.

14. The method according to claim 9, wherein said photoresist layer comprises a negative photoresist layer.

15. A method of manufacturing a phase grating image sensor, said method comprising:

providing a silicon substrate having a plurality of photodiode thereon, a first flattening layer on said photodiode, a color filter layer on said first flattening layer and a second flattening layer on said color filter layer, wherein said first flattening layer and said second flattening layer are transparent for incident beam;

forming a photoresist layer over said second flattening layer;

transferring a plurality of phase grating pattern into said photoresist layer to expose said second flattening layer, wherein each said phase grating pattern comprises a plurality of concentric circle and corresponds to each respective underlying said photodiode;

anisotropically etching said second flattening layer to a predetermined depth to form a plurality of phase grating lens, wherein each said phase grating lens comprises a plurality of concentric circular trench each with a predetermined radius; and removing said photoresist layer.

16. The method according to claim 15, wherein said first flattening layer comprises a polyimide layer.

17. The method according to claim 15, wherein said second flattening layer comprises a polyimide layer.

18. The method according to claim 15, wherein said color filter layer comprises red, green and blue color filters.

19. The method according to claim 15, wherein said photoresist layer comprises a positive photoresist layer.

20. The method according to claim 15, wherein said photoresist layer comprises a negative photoresist layer.

* * * * *